United States Patent
Nakai et al.

(10) Patent No.: US 8,859,032 B2
(45) Date of Patent: Oct. 14, 2014

(54) ORGANIC EL DEVICE MANUFACTURING METHOD AND APPARATUS

(75) Inventors: Takahiro Nakai, Ibaraki (JP); Shigenori Morita, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 175 days.

(21) Appl. No.: 13/332,864

(22) Filed: Dec. 21, 2011

(65) Prior Publication Data

US 2012/0171359 A1    Jul. 5, 2012

(30) Foreign Application Priority Data

Dec. 22, 2010  (JP) .................................. 2010-286002

(51) Int. Cl.
| B05D 5/00 | (2006.01) |
| H01L 51/00 | (2006.01) |
| C23C 14/04 | (2006.01) |
| C23C 14/12 | (2006.01) |
| H01L 51/56 | (2006.01) |

(52) U.S. Cl.
CPC .......... *H01L 51/0011* (2013.01); *C23C 14/042* (2013.01); *C23C 14/12* (2013.01); *H01L 51/0012* (2013.01); *H01L 51/56* (2013.01)
USPC .......................................................... 427/64

(58) Field of Classification Search
USPC .......................................................... 427/64
See application file for complete search history.

(56) References Cited

U.S. PATENT DOCUMENTS

2007/0148348 A1*  6/2007 Huh et al. .................. 427/248.1

FOREIGN PATENT DOCUMENTS

| EP | 0488535 A2 * | 11/1991 |
| EP | 0488535 A2 | 6/1992 |
| JP | 62-243758 A | 10/1987 |
| JP | 63-073654 A | 4/1988 |
| JP | 2000-313951 A | 11/2000 |
| JP | 2003-133067 A | 5/2003 |
| JP | 2003133067 * | 5/2003 |
| JP | 2003-173870 A | 6/2003 |
| JP | 2003173870 * | 6/2003 |

OTHER PUBLICATIONS

JP 2003-173870, machine transaltion, 2003.*
European Search Report dated Mar. 26, 2012, issued in corresponding European application No. 11194375.9.
Japanese Office Action mailed Apr. 19, 2013, issued in corresponding Japanese Patent Application No. 2010-286002. With partial translation.

* cited by examiner

*Primary Examiner* — Robert Vetere
(74) *Attorney, Agent, or Firm* — Westerman, Hattori, Daniels & Adrian, LLP (57) ABSTRACT

An organic EL device manufacturing method includes a step of supplying a substrate, and while moving the substrate with a non-electrode-layer side thereof in contact with a surface of a can roller, the non-electrode-layer provided with no electrode layer, discharging a material from a nozzle of a vapor deposition source to form an organic layer on an electrode-layer side of the substrate, the electrode-layer side provided with an electrode layer. The vapor deposition step includes supplying a shadow mask including an opening portion to interpose the shadow mask between the substrate contacting the can roller, and the nozzle; and forming the organic layer corresponding to the opening portion on the electrode-layer side of the substrate while moving the substrate and the shadow mask with through holes included at each of the substrate and the shadow mask engaged with projections included in the can roller.

2 Claims, 7 Drawing Sheets

ORGANIC EL DEVICE MANUFACTURING METHOD AND APPARATUS

CROSS REFERENCE TO RELATED APPLICATION

This application claims priority from Japanese Patent Application No. 2010-286002, which is incorporated herein by reference.

BACKGROUND OF THE INVENTION

1. Field of the Invention

The present invention relates to a method and apparatus for manufacturing an organic EL device including an organic layer on an electrode layer formed on a substrate and emitting light from the organic layer.

2. Description of the Related Art

In recent years, organic EL (electroluminescence) devices are drawing attention as devices for use in next-generation low-power-consumption light-emitting display apparatuses. Basically, organic EL devices each include at least one organic layer including a light-emitting layer made of an organic light-emitting material and a pair of electrodes. Such organic EL devices emit light in various colors depending on the organic light-emitting materials. Furthermore, because of being self-light-emitting devices, the organic EL devices are drawing attention for use in displays such as those of televisions (TV).

An organic EL device includes at least one organic layer including a light-emitting layer, sandwiched between two electrode layers having polarities opposite to each other (sandwich structure), and the at least one organic layer includes an organic film having a thickness of several nanometers to several tens of nanometers. Furthermore, the organic layer sandwiched between the electrode layers is supported on a substrate, that is, the anode layer (electrode layer), the organic layer and the cathode layer are deposited on the substrate in this order to form an organic EL device. In the case of a plurality of organic layers included in an organic EL device, an anode layer is formed on a substrate, organic layers are sequentially deposited on the anode layer, and then a cathode layer is formed on the deposited organic layers, thereby forming an organic EL device.

As methods for forming organic layers on an anode layer formed on a substrate in manufacturing such organic EL device, vacuum vapor deposition and film coating are generally known. Among these methods, vacuum vapor deposition is mainly used because the purity of materials for forming the organic layers (organic layer forming materials) can be increased, facilitating provision of long-life products.

In vacuum vapor deposition as mentioned above, a vapor deposition source is provided for each organic layer at a position facing a substrate in a vacuum chamber of a vapor deposition apparatus for performing vapor deposition. More specifically, each organic layer forming material is heated and evaporated in a heating section located in a vapor deposition source, and the evaporated organic layer forming material (evaporated material) is radially discharged from a nozzle provided at the vapor deposition source to deposit onto an anode layer formed on the substrate. The organic layer forming material is thereby vapor-deposited on the anode layer.

In such vacuum vapor deposition, what is called a batch process or a roll process is employed. A batch process is a process in which an organic layer is vapor-deposited on an anode layer for each of substrates each including an anode layer formed thereon. Meanwhile, a roll process is a process in which a strip-shaped substrate including an anode layer formed thereon, which has been rolled up, is continuously unwound (what is called a roll-to-roll manner), the unwound substrate is supported by a surface of a can roller, which rotates, to move the substrate along with the rotation to sequentially vapor-deposit respective organic layers on the anode layer, and the substrate with the respective organic layers vapor-deposited thereon is rolled up again. From among these processes, it is desirable that organic devices be manufactured using the roll process from the perspective of cost reduction.

For forming a plurality of layers on an anode layer when manufacturing an organic EL device using the roll process in vacuum vapor deposition as described above, in order to form respective organic layers of desired patterns, the organic layers are sequentially deposited on the anode layer via a what is called a shadow mask including opening portions. Furthermore, in order to deposit the respective layers with high position accuracy, alignment is required for the respective layers. Accordingly, use of an alignment mechanism for adjusting displacements of respective organic layers in the organic layer formation using such shadow mask has been proposed (cf., Patent. Document 1)

Patent Document 1 discloses that a displacement in a direction perpendicular to a direction of movement of a substrate (TD direction) is detected by recognizing a pattern or alignment marks of an organic light-emitting layer (organic layer) by means of an image recognition camera and adjusted by adjusting the positions and angles of a pair or guide rollers, while a displacement in the direction of movement of the substrate (MD direction) is adjusted by adjusting the passage route of the substrate by means of an accumulator.

PRIOR ART DOCUMENTS

Patent Documents

Patent Document 1: Japanese Patent Application Laid-open No. 2003-173870

SUMMARY OF THE INVENTION

However, for installing mechanisms such as an image recognition camera and an accumulator in a vacuum chamber as in Patent Document 1, it is necessary to secure a pressure resistance of the camera and increase the volume of the chamber, which may result in an increase in size and cost of the organic EL device manufacturing apparatus.

In addition, in order to sequentially form respective layers on an anode layer without using the aforementioned accumulator, it is necessary to synchronize the substrate and the shadow mask with each other in terms of transport speed; however, it is extremely difficult to make both transport speeds completely correspond to each other, and thus, the amount of displacement in the MD direction may increase as the transport of the substrate advances.

Furthermore, ordinarily, the substrate and the shadow mask are made of different materials, and thus, have different linear expansion coefficients depending on the difference in material. Thus, as the temperature inside the vacuum chamber increases as a result of evaporating a layer forming material, the accuracy of alignment between the substrate and the shadow mask may be lowered.

In view of the aforementioned problems, an object of the present invention is to provide an organic EL device manufacturing method and apparatus capable of efficiently manufacturing organic EL devices by suppressing displacements of respective layers formed on a substrate in a direction of movement thereof and a direction perpendicular to the direction of movement without a complicated configuration.

As a result of diligent study to achieve the above object, the present inventors found that respective layers can be deposited without displacements by forming through holes in a substrate and a shadow mask, providing projections for alignment at a surface of a can roller on a side supporting the substrate, and engaging the projections with the through holes of the substrate and the shadow mask, thereby aligning the substrate and the shadow mask with each other, and sequentially vapor-depositing the respective layers on an anode layer via the shadow mask in this state, and thereby completed the present invention.

In other words, an organic EL device manufacturing method according to the present invention including forming an organic layer on an electrode-layer side of a strip-shaped substrate, while moving the substrate, the electrode-layer side being provided with an electrode layer, including:

a vapor deposition step of supplying the strip-shaped substrate, and while moving the substrate with a non-electrode-layer side thereof in contact with a surface of a can roller that rotates, discharging an evaporated organic layer forming material from a nozzle of a vapor deposition source arranged so as to face the can roller to form an organic layer on the electrode-layer side of the substrate, the non-electrode layer side being provided with no electrode layer, wherein the vapor deposition step further comprises:

supplying a shadow mask including an opening portion so as to interpose the shadow mask between the substrate held in contact with the can roller, and the nozzle; and by using a substrate and a shadow mask each including a plurality of through holes arranged in a longitudinal direction for the substrate and the shadow mask, respectively, and using a can roller including projections that engage with the through holes for the can roller, forming the organic layer corresponding to the opening portion on the electrode-layer side of the substrate, while moving the substrate and the shadow mask with the through holes of the substrate and the shadow mask engaged with the projections.

Consequently, mere engagement of the through holes of the substrate and the shadow mask with the projections enables alignment between the shadow mask and the substrate, enabling an organic layer to be deposited on the electrode layer while such alignment is being made. Accordingly, organic EL devices can efficiently be manufactured with alignment of respective layers formed on the substrate in a direction of movement thereof and a direction perpendicular to the direction of movement adjusted without employing a complicated configuration.

Also, in the present invention, it is preferable that the projections each have a taper shape tapering from a can roller side thereof toward a distal end thereof, and a diameter of the through holes of the shadow mask be smaller than a diameter of the through holes of the substrate.

Consequently, the substrate and the shadow mask face each other with a gap therebetween, enabling prevention of breakage of the substrate resulting from contact with the shadow mask.

Furthermore, an organic EL device manufacturing apparatus according to the present invention includes:

a substrate supply section that supplies a strip-shaped substrate including an electrode layer formed thereon;

a can roller that rotates along with movement of the substrate while being in contact with a non-electrode-layer side of the supplied substrate, the non-electrode-layer side being provided with no electrode layer;

a vapor deposition source arranged so as to face the can roller, the vapor deposition source discharging an evaporated organic layer forming material from a nozzle to form an organic layer on an electrode-layer side of the substrate held in contact with the can roller, the electrode layer side being provided with an electrode layer; and a shadow mask supply section that supplies a shadow mask including an opening portion so as to interpose the shadow mask between the substrate held in contact with the can roller, and the nozzle, wherein the substrate and the shadow mask each include a plurality of through holes arranged in a longitudinal direction, and the can roller includes projections that engage with the through holes to support the substrate and the shadow mask.

As described above, the present invention enables efficient manufacturing of organic EL devices by suppressing displacements of respective layers formed on a substrate in a direction of movement thereof and a direction perpendicular to the direction of movement without employing a complicated configuration.

DETAILED DESCRIPTION OF THE PREFERRED EMBODIMENTS

An organic EL device manufacturing method and apparatus according to the present invention will be described below with reference to the drawings.

Figure 1:
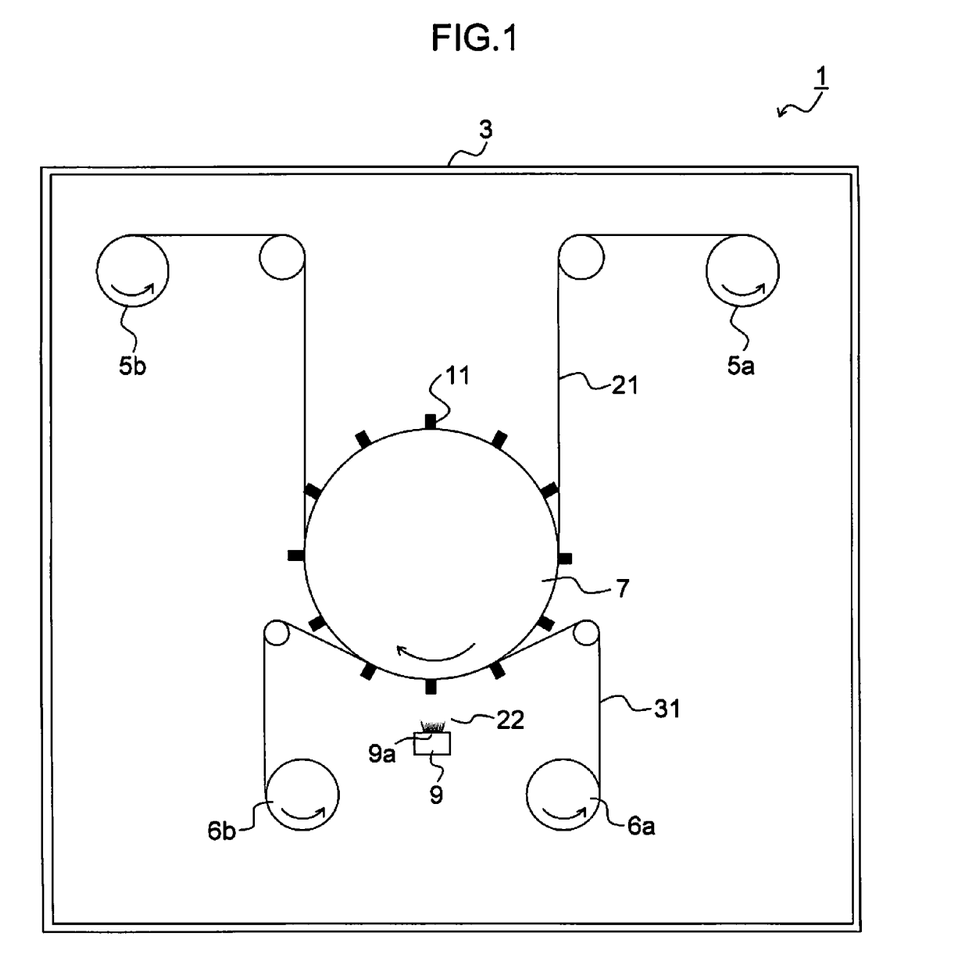
FIG. 1 is a schematic cross-sectional side view of an organic EL device manufacturing apparatus according to a first embodiment of the present invention.
Figure 2:
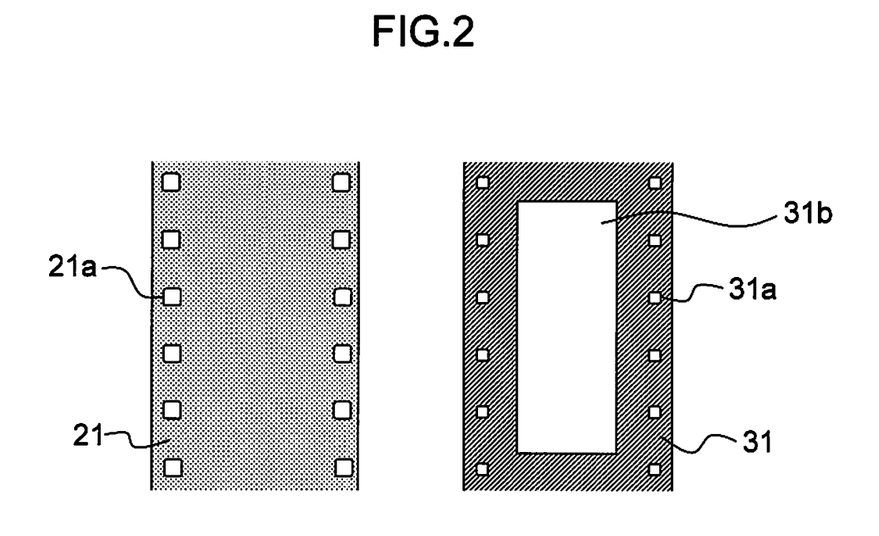
FIG. 2 is a diagram schematically illustrating a substrate and a shadow mask in the present embodiment.
Figure 3:
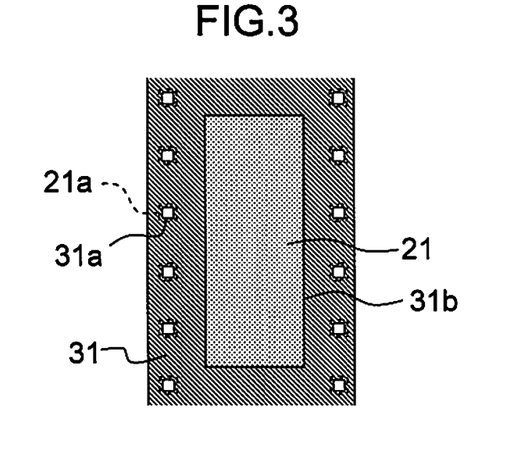
FIG. 3 is a diagram schematically illustrating a state in which the substrate and the shadow mask in the present embodiment have been put together.
Figure 4A:
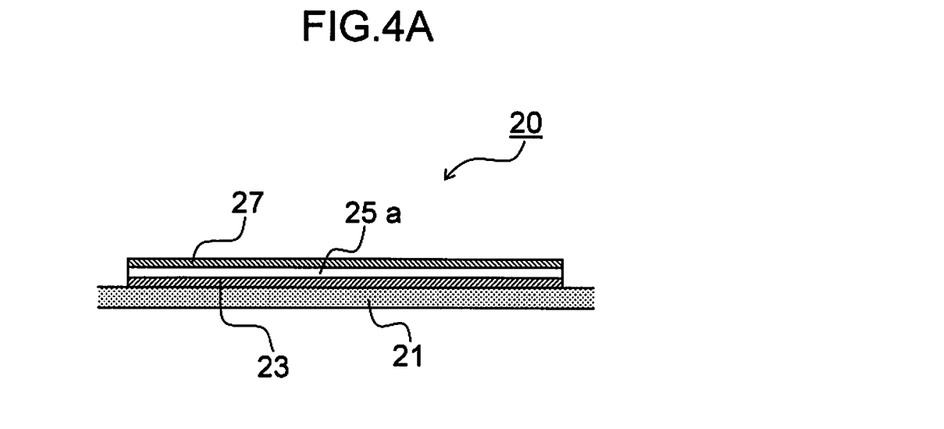
FIG. 4A is a schematic cross-sectional diagram of an example of a configuration of layers of an organic EL device.
Figure 4B:
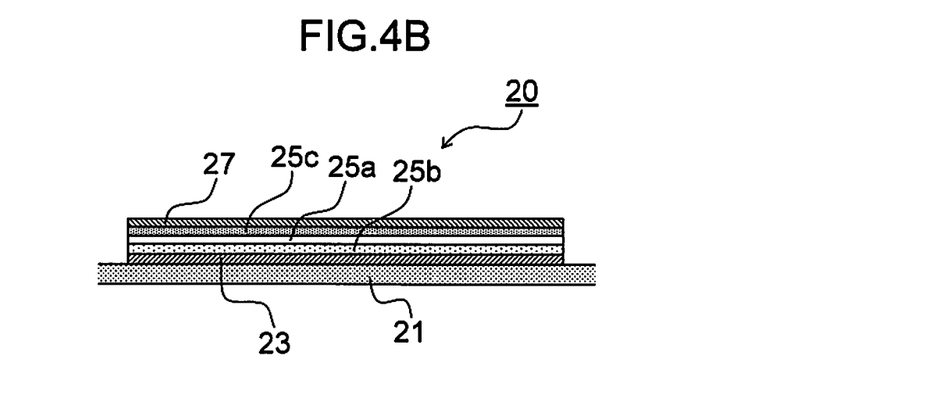
FIG. 4B is a schematic cross-sectional diagram of an example of a configuration of layers of an organic EL device.
Figure 4C:
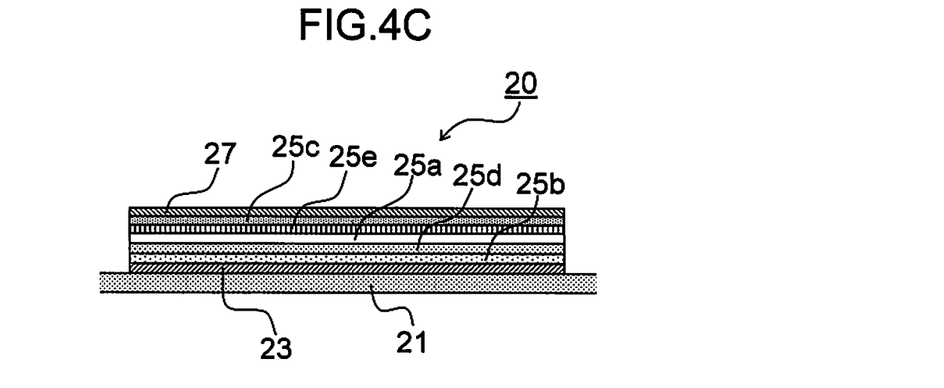
FIG. 4C is a schematic cross-sectional diagram of an example of a configuration of layers of an organic EL device.

First, an organic EL device manufacturing apparatus and method according to a first embodiment of the present invention will be described. FIG. 1 is a schematic cross-sectional side view of an example of an organic EL device manufacturing apparatus according to a first embodiment of the present invention, FIG. 2 is a diagram schematically illustrating a substrate and a shadow mask in the present embodiment, FIG. 3 is a diagram schematically illustrating a state in which the substrate and the shadow mask in the present embodiment have been put together, and FIGS. 4A, 4B and 4C are schematic cross-sectional diagrams each illustrating a configuration of layers of an organic EL device.

As illustrated in FIG. 1, an organic EL device manufacturing apparatus 1 is a vapor deposition apparatus including a vacuum chamber 3, and in the vacuum chamber 3, roughly, a substrate supply device (substrate supply section) 5a, a can roller 7 and a vapor deposition source 9 are arranged. The inside of the vacuum chamber 3 is made to enter a pressure-reduced state by a non-illustrated vacuum generator.

The substrate supply device 5a unwinds a rolled-up strip-shaped substrate 21 to supply the substrate 21 to the can roller 7. After having been supplied to the can roller 7, the substrate 21 unwound from the substrate supply device 5a is wound up by a substrate collection device 5b. In other words, the substrate 21 is unwound and wound up in a roll-to-roll manner.

A shadow mask supply device (shadow mask supply section) 6a unwinds a rolled-up strip-shaped shadow mask (shadow mask) 31 to supply the shadow mask 31 to the can roller 7 so as to interpose the shadow mask 31 between the substrate 21 and a nozzle 9a. After having been supplied to the can roller 7, the shadow mask 31 unwound from the shadow mask supply device 6a is wound up by a shadow mask collection device 6b. In other words, the shadow mask 31 is unwound and wound up in a roll-to-roll manner.

The can roller 7 is made of a stainless steel and is configured to rotate. A plurality of alignment pins (projections) 11 are provided at opposite end portions in a width direction of a circumferential surface of the can roller 7. The alignment pins 11 each have a quadrangular prism shape here, and are arranged at a predetermined interval in a circumferential direction of the can roller 7.

The can roller 7 preferably includes a temperature control mechanism such as a cooling mechanism inside, enabling a temperature of the substrate 21 to be stabilized during formation of an organic layer on the substrate 21, which will be described later. An outer diameter of the can roller 7 may be determined in a range of, for example, 300 to 2000 mm.

Meanwhile, first through holes (through holes) 21a, which are to be fitted around the respective alignment pins 11, are formed at opposite end portions in a width direction of the substrate 21. Such first through holes 21a are formed at an interval in the width direction and an interval in a circumferential direction that are the same as those of the alignment pins 11, and are formed so as to have a shape and a size that are the same as those of it cross section of the respective alignment pins 11. Consequently, upon the alignment pins 11 being inserted into the first through holes 21a of the substrate 21, the first through holes 21a and the alignment pins 11 are engaged with each other, and the substrate 21 moves along with rotation of the can roller 7 (in a clockwise direction in FIG. 1).

Furthermore, in a state in which the alignment pins 11 and the first through holes 21a are engaged with each other, the substrate 21 is restricted from movement in a direction of movement of the substrate 21 (MD direction) and a direction perpendicular to the direction of movement (TD direction). Also, at a region in which the substrate 21 faces the vapor deposition source 9 and a region in vicinity of such region, a back surface of the substrate 21 is brought into contact with a surface of the can roller 7.

Second through holes (through holes) 31a, which are to be fitted around the respective alignment pins 11, are firmed at opposite end portions in a width direction of the shadow mask 31. Such second through holes 31a are formed at an interval in the width direction and an interval in a circumferential direction that are the same as those of the alignment pins 11, and are formed so as to have a shape and a size that are the same as those of the cross-section of the alignment pins 11. Consequently, upon the alignment pins 11 being inserted into the second through holes 31a of the shadow mask 31, the second through hole 31a and the alignment pin 11 are engaged with each other, and the shadow mask 31 moves along with the rotation of the can roller 7 (in the clockwise direction in FIG. 1).

Furthermore, in a state in which the alignment pins 11 and the second through holes 31a are engaged with each other, the shadow mask 31 is restricted from movement in a direction of movement of the substrate 21 (MD direction) and a direction perpendicular to the direction of movement (TD direction). Also, at a region in which the shadow mask 31 faces the vapor deposition source 9 and a region in the vicinity of such region, a back surface of the shadow mask 31 is brought into contact with a front surface of the substrate 21.

A plurality of opening portions 31b are longitudinally formed at a center portion in the width direction of the shadow mask 31. When the shadow mask 31 faces the substrate 21, the opening portions 31b allow an organic layer forming material 22 discharged from the vapor deposition source 9, which will be described later, to pass therethrough to form an organic layer on an anode layer 23 formed on the substrate 21. Such opening portions 31b each have a desired shape and the organic layer corresponding to the opening portions 31b is formed on the anode layer 23.

Upon rotation of the can roller 7, the substrate 21 is consecutively fed out from the substrate supply device 5a along with the rotation, and the first through holes 21a of the fed-out substrate 21 are fitted around the alignment pins 11. Simultaneously with that, the shadow mask 31 is consecutively fed out from the shadow mask supply device 6a along with the rotation of the can roller 7, and the second through holes 31a of the shadow mask 31 are fitted around the alignment pins 11, and the shadow mask 31 is interposed between the substrate 21 and the nozzle 9a.

Then, the substrate 21 and the shadow mask 31 move in a direction of the rotation of the can roller 7 while being supported by the can roller 7, and when the substrate 21 and the shadow mask 31 move away from the can roller 7, the first through holes 21a of the substrate 21 and the second through holes 31a of the shadow mask 31 are disengaged from the alignment pins 11. Next, the substrate 21 and the shadow mask 31, which have been separated from the can roller 7, are wound up by the substrate collection device 5b and the shadow mask collection device 6b, respectively.

The interval in the circumferential direction and the interval in the width direction of the alignment pins 11 are not specifically limited as long as an evaporated organic layer forming material 22 can be deposited on the substrate 21 via the opening portions 31b of the shadow mask 31 with the substrate 21 and the shadow mask 31 aligned with each other. However, a decrease in number of alignment pins 11 in the circumferential direction may result in displacements in position of the substrate 21 and the shadow mask 31.

Meanwhile, an increase in number of alignment pins 11 in the circumferential direction can more reliably suppress misalignment, but may result in breakage of the substrate 21 and the shadow mask 31 because the interval of the first through holes 21a and the interval of the second through holes 31a are made to be small due to the increase. Accordingly, the number of alignment pins 11 in the circumferential direction can be determined, for example, taking the aforementioned points into consideration, and for example, twelve alignment pins 11 can be arranged at an equal pitch of 30°, or 36 alignment pins 11 can be arranged at an equal pitch of 10°.

For a material for forming the substrate 21, a flexible material that is not damaged when looped over the can roller 7 is used, and examples of such material can include metal materials, non-metal inorganic materials and resin materials.

Examples of the metal materials include stainless steels, alloys such as iron-nickel alloys, copper, nickel, iron, aluminum and titanium. Furthermore, examples of the aforementioned iron-nickel alloys can include alloy 36 and alloy 42. From among these materials, it is preferable that the metal material be a stainless steel, copper, aluminum or titanium, from the perspective of ease of application of the metal material to the roll process. Furthermore, the substrate made of such metal material preferably has a thickness of 5 to 200 μm from the perspective of ease of handling and winding up the substrate.

Examples of the non-metal inorganic materials can include glass. In this case, as the substrate made of a non-metal inorganic material, a flexible thin-film glass can be used. Furthermore, the substrate made of such non-metal material preferably has a thickness of 5 to 500 μm from the perspective or sufficient mechanical strength and moderate plasticity.

Examples of the resin materials can include synthetic resins such as thermosetting resins and thermoplastic resins. Examples of such synthetic resins can include polyimide resins, polyester resins, epoxy resins, polyurethane reins, polystyrene resins, polyethylene resins, polyamide resins, acrylonitrile butadiene styrene (ABS) copolymer resins, polycarbonate resins, silicone resins and fluorine resins. Furthermore, for the substrate made of such resin material, a film of any of the aforementioned synthetic reins can be used, for example. Furthermore, the substrate made of such resin material preferably has a thickness of 5 to 500 μm from the perspective of sufficient mechanical strength and moderate plasticity.

For a material forming the shadow mask 31, a flexible material that is not damaged when looped over the can roller 7 is used, and examples of such material can include metal materials, non-metal inorganic materials and resin materials.

Examples of the metal materials include stainless steels, alloys such as iron-nickel alloys, copper, nickel, iron, aluminum and titanium. Furthermore, examples of the aforementioned iron-nickel alloys can include alloy 36 and alloy 42. From among these materials, it is preferable that the metal material be a stainless steel, copper, aluminum or titanium, from the perspective of sufficient mechanical strength, moderate flexibility and ease of application of the metal material to the roll process. Furthermore, the substrate made of such metal material preferably has a thickness of 5 to 200 μm from the perspective of ease of handling and winding up the substrate.

Examples of the non-metal inorganic materials can include glass. In this case, as the substrate made of a non-metal inorganic material, a flexible thin-film glass can be used. Furthermore, the substrate made of such non-metal material preferably has a thickness of 5 to 500 μm from the perspective of sufficient mechanical strength and moderate plasticity.

Examples of the resin materials can include synthetic resins such as thermosetting resins and thermoplastic resins. Examples of such synthetic resins can include polyimide resins, polyester resins, epoxy resins, polyurethane reins, polystyrene resins, polyethylene resins, polyamide resins, acrylonitrile butadiene styrene (ABS) copolymer resins, polycarbonate resins, silicone resins and fluorine resins. Furthermore, for the substrate made of such resin material, a film of any of the aforementioned synthetic reins can be used, for example. Furthermore, the substrate made of such resin material preferably has a thickness of 5 to 500 μm from the perspective of sufficient mechanical strength and moderate plasticity.

Furthermore, the shadow mask 31 is preferably made of a material that is the same as that of the substrate 21. Consequently, the shadow mask 31 and the substrate 21 have linear expansion coefficients equal to each other, enabling suppression of misalignment attributable to the difference in linear expansion coefficient.

In the present embodiment, as a specific example of the substrate 21, one with an anode layer 23 (cf. FIGS. 4A to 4C) formed thereon in advance by means of sputtering can be used.

For a material for forming the anode layer 23, any of various transparent conductive materials such as indium zinc oxide (IZO) and indium tin oxide (ITO), metals such as gold, silver or platinum and alloy materials can be used.

The vapor deposition source 9 is provided for each of the organic layers in at least one organic layer including a light-emitting layer 25a (cf. FIGS. 4A to 4C). Each vapor deposition source 9 is arranged at a position facing a region of the circumferential surface of the can roller 7 that supports the substrate 21, and vapor-deposits a material for forming an organic layer (organic layer forming material 22) on the substrate 21, thereby sequentially forming organic layers (cf. FIGS. 4A to 4C) on the substrate 21. A configuration of such vapor deposition sources 9 is not limited as long as the configuration includes a nozzle capable of discharging an evaporated organic layer forming material 22 toward the substrate 21. For example, a vapor deposition source 9 configured to heat and evaporate an organic layer forming material 22 in its inside can be employed.

Each vapor deposition source 9, which can accommodate an organic layer forming material 22, and includes a nozzle 9a and a heating section (not illustrated). The nozzle 9a is arranged so as to face the region of the can roller 7 that supports the substrate 21. The heating section is configured to heat and evaporate the organic layer forming material 22, and the evaporated organic layer forming material 22 is discharged to the outside from the nozzle 9a.

Then, upon the organic layer forming material 22 being heated in the vapor deposition source 9, the organic layer forming material 22 is evaporated, the evaporated organic layer forming material 22 is discharged from the nozzle 9a toward the substrate 21, and the discharged organic layer forming material 22 passes through an opening portions 31b of the shadow mask 31 and deposited on the anode layer 23 formed on the substrate 21. As a result of the evaporated organic layer forming material 22 being deposited on the anode layer 23, an organic layer is formed on the anode layer 23.

The organic layers are not specifically limited as long as the organic layers include an organic layer that is the light-emitting layer 25a, and for example, as illustrated in FIG. 4B, a hole injection layer (organic layer) 25b, a light-emitting layer 25a and an electron injection layer (organic layer) 25c can be deposited in this order to provide a three-layer structure. Alternatively, as necessary, a hole transport layer (organic layer) 25d (cf. FIG. 4C) can be interposed between the light-emitting layer 25a and the hole injection layer 25b illustrated in FIG. 4B or an electron transport layer (organic layer) 25e (cf. FIG. 4C) can be interposed between the light-emitting layer 25a and the electron injection layer 25c to provide a four-layer structure of organic layers.

Furthermore, as illustrated in FIG. 4C, a hole transport layer 25d can be interposed between the hole injection layer 25b and the light-emitting layer 25a, and an electron transport layer 25e can be interposed between the light-emitting layer 25a and the electron injection layer 25c to provide a five-layer structure of organic layers. Although each organic layer is ordinarily designed to have a thickness of around several nanometers to several tens of nanometers, such thickness is not specifically limited because the thickness is arbitrarily determined depending on, e.g., the organic layer forming material 22 and/or the light emitting property.

For a material for forming the light-emitting layer 25a, for example, tris(8-hydroxyquinoline)aluminum (Alq3), and 4,4'-N,N'-dicarbazolyl biphenyl (CBP) with iridium complex (Ir(ppy)3) doped therein, can be used.

For a material for forming the hole injection layer 25b, for example, copper phthalocyanine (CuPc) or 4,4'-bis[N-4-(N, N-di-m-tolylamino)phenyl]-N-phenylamino]biphenyl (DNTPD) can be used.

For a material for forming the hole transport layer 25d, for example, 4,4'-bis[N-(1-naphthyl)-N-phenylamino]biphenyl (α-NPD) or N,N'-diphenyl-N,N'-bis(3-methylphenyl)-1,1'-biphenyl 4,4'-diamine (TPD) can be used.

For a material for forming the electron injection layer 25c, for example, lithium fluoride (LiF), cesium fluoride (CsF) or lithium oxide ($Li_2O$) can be used.

For a material for forming the electron transport layer 25e, for example, tris(8-hydroxyquinoline)aluminum (Alq3), bis (2-methyl-8-quinolinolato)-4-phenylphenolate-aluminum (BAlq) or OXD-7(1,3-bis[5-(p-tert-butylphenyl)-1,3,4-oxadiazole-2-yl]benzene can be used.

A plurality of vapor deposition sources 9 can be arranged according to the configuration and/or number of organic layers formed on the substrate 21 as described above. For example, as illustrated in FIG. 4B, where three organic layers are deposited, three vapor deposition sources 9 can be arranged for the respective layers. Where a plurality of vapor deposition sources 9 are provided as described above, a first organic layer is vapor-deposited on the anode layer 23 by a vapor deposition source 9 arranged at a most upstream position in a direction of rotation of the can roller 7 and then, a second organic layer is sequentially vapor-deposited on the first organic layer by means of a vapor deposition source 9 on the downstream side.

Upon an evaporated organic layer forming material 22 being discharged from a vapor deposition source 9 to the substrate 21 and the shadow mask 31 supported by the can roller 7 while the substrate 21 and the shadow mask 31 are aligned by engagement between the alignment pins 11 formed on the can roller 7 and the first through hole 21a and the second through hole 31a (alignment adjustment), the material 22 that has passed through the opening portions 31b of the shadow mask 31 is vapor-deposited on the anode layer 23 formed on the substrate 21. Consequently, an organic layer corresponding to the shape and size of the opening portions 31b is formed on the anode layer 23. As a result of such vapor-deposition, which is sequentially performed for each of the organic layers, the respective organic layers are deposited on the anode layer 23.

Figure 8:
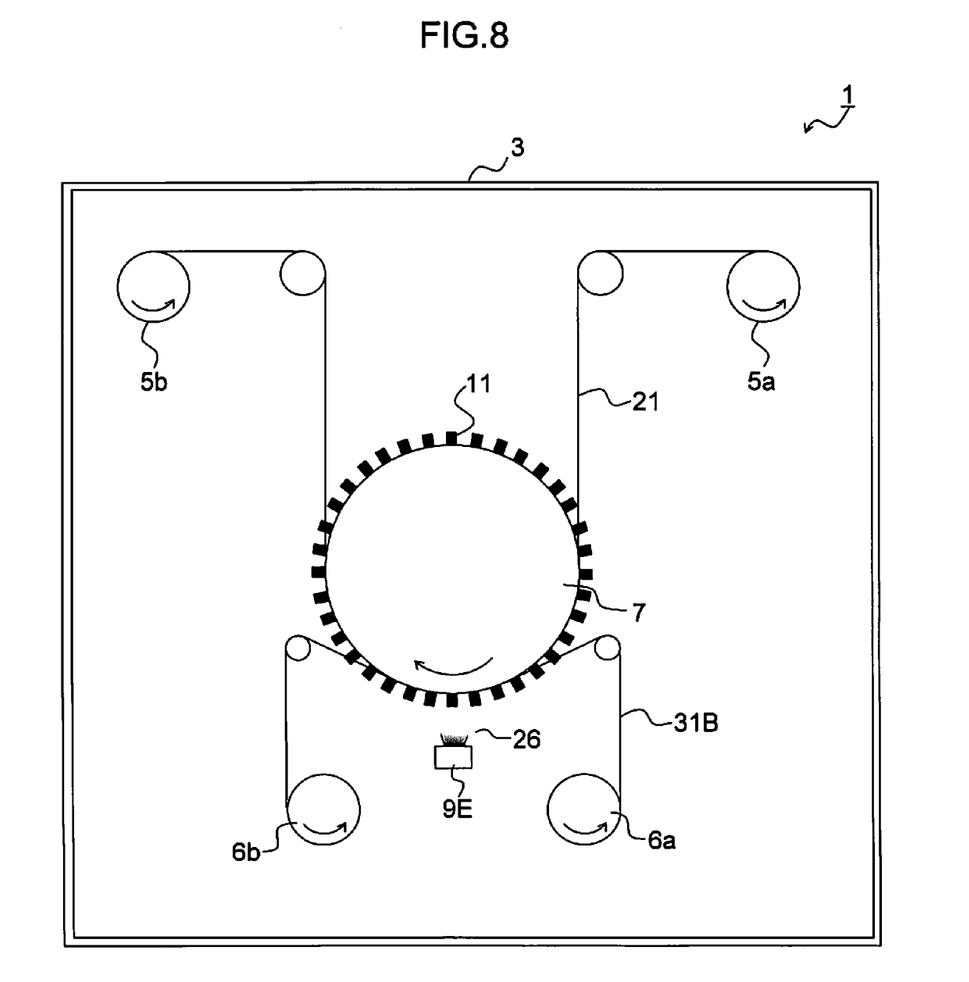
FIG. 8 is a schematic sectional side view of a configuration when a cathode layer is formed in the organic EL device manufacturing apparatus used in the example.

After the formation of the organic layers on the anode layer 23 formed on the substrate 21 as described above, for example, the substrate 21 is wound up, and a vapor deposition source for forming a cathode layer 27 is arranged in place of the vapor deposition sources 9 for forming the aforementioned organic layers (cf. FIG. 8). Then, a cathode layer (layer) 27 is formed on the organic layers while the substrate 21 and the shadow mask 31 are aligned with each other in a manner similar to the above, and consequently, an organic EL device 20 with the anode layer 23, the organic layer and the cathode layer 27 deposited in this order on the substrate 21 as illustrated in FIGS. 4A to 4C is manufactured. It should be noted that when forming the cathode layer 27, a shadow mask for forming the cathode layer 27 can be used instead of the shadow mask 31 for forming the organic layers.

For the cathode layer 27, e.g., aluminum (Al), silver (Ag), ITO, an alkali metal or an alloy containing an alkali earth metal can be used. Alternatively, a vacuum film forming device such as a sputtering device can be arranged in place of the vapor deposition sources 9 for forming the organic layers to deposit (form) the cathode layer 27 on the organic layers while the substrate 21 and the shadow mask 31 are aligned with each other as described above. Alternatively, the vapor deposition source for forming the cathode layer 27 can be arranged downstream of a most downstream vapor deposition source 9 to form the cathode layer 27 on the organic layers following the formation of the organic layers. Furthermore, the cathode layer 27 can be deposited on the organic layers in a conventionally known method that is different from the aforementioned methods.

Also, at the position in the vacuum chamber 3 that faces the region of the can roller 7 that supports the substrate 21, a vacuum film forming device for forming the anode layer 23 such as a sputtering device can be arranged upstream of the vapor deposition sources 9, which are to form the organic layers, with respect to the direction of rotation of the can roller 7 to form the anode layer 23 on the substrate 21, which moves while being supported by the can roller 7, before vapor deposition of the organic layers.

Otherwise, where a material that can be vapor-deposited by a vapor deposition source is used for a material for the anode layer 23, a vapor deposition source for the anode layer 23 can be arranged in the vacuum chamber 3 to successively vapor-deposit the anode layer 23, the organic layers and the cathode layer 27 on the substrate 21 in this order, thereby forming the organic EL device 20.

Diameters (sizes) of the first through holes 21a of the substrate 21 and the second through holes 31a of the shadow mask 31 are not specifically limited as long as the alignment of the substrate 21 and the shadow mask 31 can be adjusted. However, there is a tendency for a region in which the organic layers can be formed to be narrower in the width direction of the substrate 21 as these first through holes 21a and the second through holes 31a are larger. Accordingly, for example, taking such point into consideration, the sizes of the first and second through holes 21a and 31a are preferably not more than 10 mm, more preferably not more than 5 mm, and further preferably not more than 2 mm in the width direction (TD direction). Also, the sizes are preferably not more than 10 mm, more preferably not more than 5 mm and further preferably not more than 2 mm in the MD direction. Methods for forming the first through holes 21a and the second through holes 31a are not specifically limited however, the first through holes 21a and the second through holes 31a can be formed by, for example, punching or photo-etching.

An outer diameter of the quadrangular prism-shaped alignment pins 11 is not specifically limited as long as the alignment pins 11 can engage with the first through holes 21a and the second through holes 31a and such engagement enables alignment between the substrate 21 and the shadow mask 31, and thus, can be arbitrarily determined according to the shapes of the first through holes 21a and the second through holes 31a.

Next, an organic EL device manufacturing method according to the first embodiment using the above-described manufacturing apparatus will be described.

An organic EL device manufacturing method according to the present embodiment, which includes forming an organic layer on an electrode-layer side of a strip-shaped substrate, while moving the substrate, the electrode-layer side being provided with an electrode layer, includes: a vapor deposition step of supplying the strip-shaped substrate, and while moving the substrate with a non-electrode-layer side thereof in contact with a surface of a can roller that rotates, discharging an evaporated organic layer forming material from a nozzle of a vapor deposition source arranged so as to face the can roller to form an organic layer on the electrode-layer side of the substrate, the non-electrode layer side being provided with no electrode layer, wherein the vapor deposition step further includes: supplying a shadow mask including an opening portion so as to interpose the shadow mask between the substrate held in contact with the can roller, and the nozzle; and by using a substrate and a shadow mask each including a plurality of through holes arranged in a longitudinal direction for the substrate and the shadow mask, respectively, and using a can roller including projections that engage with the through holes for the can roller, forming the organic layer corresponding to the opening portion on the electrode-layer side of the substrate, while moving the substrate and the shadow mask with the through holes of the substrate and the shadow mask engaged with the projections.

In the present embodiment, in the vacuum chamber 3, the rolled-up substrate 21 on which the anode layer 23 has been formed by, e.g., sputtering is unwound from the substrate supply device 5a, the first through holes 21a of the unwound substrate 21 are engaged with the alignment pins 11 of the can roller 7, which rotates in the clockwise direction in FIG. 1, the substrate 21 is thereby supported by the circumferential surface of the can roller 7, and the substrate 21 is moved together with the can roller 7 and then wound up, whereby unwinding and winding-up of the substrate 21 are performed.

Also, the rolled-up shadow mask 31 is unwound from the shadow mask supply device 6a, the second through holes 31a of the unwound shadow mask 31 are engaged with the alignment pins 11 of the can roller 7, which rotates in the clockwise direction in FIG. 1, so that the unwound shadow mask 31 faces the substrate 21, the shadow mask 31 is thereby supported by the front surface of the substrate 21, and the shadow mask 31 is moved together with the can roller 7 and the substrate 21 and then wound up, whereby unwinding and winding-up of the shadow mask 31 are performed.

As a result of the substrate 21 and the shadow mask 31 being moved together with the can roller 7 in a state in which the first through holes 21a and the second through holes 31a are engaged with the alignment pins 11, the substrate 21 and the shadow mask 31 can be moved from a position upstream of the vapor deposition sources 9 to a position downstream of the vapor deposition sources 9 in the direction of the movement while the substrate 21 and the shadow mask 31 are aligned with each other.

An organic layer forming material 22 is evaporated by each vapor deposition source 9, and the evaporated organic layer forming material 22 is discharged toward the substrate 21 and the shadow mask 31, which are moving in the aligned state as described above, and passes though the opening portions 31b of the shadow mask 31 to form an organic layer, which corresponds to the opening portions 31b, on the anode layer 23 formed on the substrate 21. Consequently, the organic layer corresponding to the shape and size of the opening portions 31b is formed on the substrate 21. Here, as described above, the substrate 21 and the shadow mask 31 are aligned with each other, enabling the organic layer to be formed on the anode layer 23 with good positional accuracy.

Furthermore, as described above, for example, the vapor deposition source for forming the cathode layer 27 can be arranged in place of the vapor deposition sources 9 for forming the organic layers after the substrate 21 with the organic layers formed thereon being wound up, to unwind the substrate 21 from the substrate supply device 5a again and form the cathode layer 27 on the organic layers while the substrate 21 and the shadow mask 31 are aligned with each other in the same manner as above. Alternatively, the vapor deposition source for forming the cathode layer 27 can be arranged at a position downstream of the most downstream vapor deposition source 9 to form the cathode layer 27 on the organic layers following the formation of the organic layers.

As described above, the present embodiment; includes a vapor deposition step of supplying the strip-shaped substrate 21 including the anode layer 23 (electrode layer) formed thereon, and while moving the substrate 21 with a non-anode layer side thereof in contact with a surface of the can roller 7 that rotates, the non-electrode layer side being provided with no anode layer 23, discharging an evaporated organic layer forming material 22 from the nozzle 9a of each vapor deposition source 9 arranged so as to face the can roller 7 to form an organic layer on an anode-layer side of the substrate 21, the anode-layer side being provided with the anode layer 23, and the vapor deposition step further includes supplying the shadow mask 31 including the opening portions 31b so as to interpose the shadow mask 31 between the substrate 21 held in contact with the can roller 7, and the nozzle 9a, and by using a substrate and a shadow mask each including a plurality of first and second through holes 21a and 31a arranged in a longitudinal direction for the substrate 21 and the shadow mask 31, respectively, and using a can roller including alignment pins 11 (projections) that engage with the first and second through holes 21a and 31a for the can roller 7, forming the organic layer corresponding to the opening portions 31b on the anode-layer side of the substrate 21, while moving the substrate 21 and the shadow mask 31 with the first and second through holes 21a and 31a of the substrate 21 and the shadow mask 31 engaged with the alignment pins 11.

Consequently, mere engagement of the first and second through holes 21a and 31a with the alignment pins 11 enables alignment between the shadow mask 31 and the substrate 21, enabling vapor deposition of the respective layers on the anode layer 23 while the alignment is being made as described above. Accordingly, organic EL devices can effectively be manufactured by suppressing displacements in the MD direction (movement direction) and the TD direction (direction perpendicular of the movement direction) of the respective layers formed on the substrate 21 without employing a complicated configuration.

Figure 5:
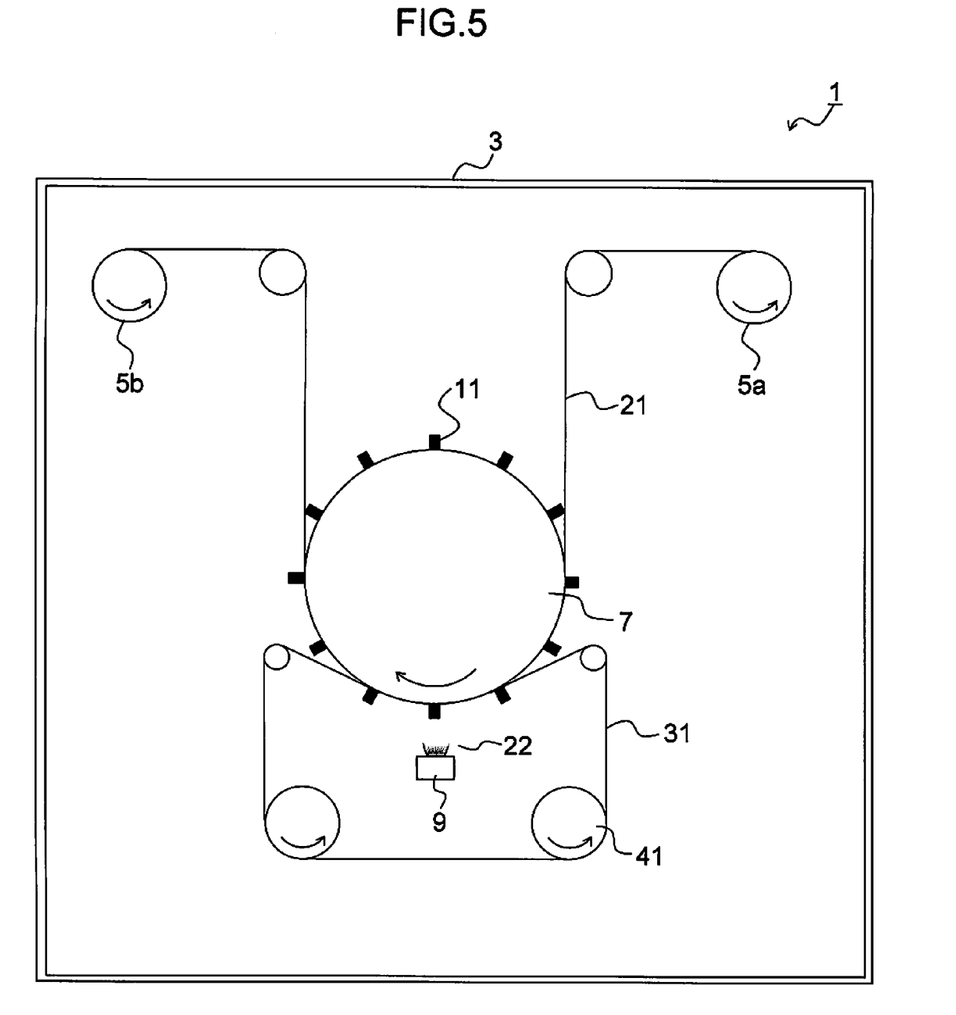
FIG. 5 is a schematic side view of an organic EL device manufacturing apparatus according to a second embodiment of the present invention.

Next, an organic EL device manufacturing method and apparatus according to a second embodiment of the present invention will be described. FIG. 5 is a diagram illustrating an organic EL device manufacturing apparatus according to a second embodiment of the present invention.

The manufacturing apparatus according to the present embodiment uses a circular (endless) shadow mask 31 instead of a rolled-up strip-shaped shadow mask 31, and such circular shadow mask 31 is looped around a plurality of rollers including a drive roller 41, and is rotated by rotating the drive roller 41 to supply the shadow mask 31 so as to face a substrate 21.

Furthermore, along with the employment of such shadow mask 31, a vapor deposition source 9 is arranged in an inner space of the shadow mask 31. The shadow mask 31 has second through holes 31a and opening portions 31b at a surface thereof, as in the first embodiment. The rest of configuration is similar to that of the manufacturing apparatus according to the first embodiment, and a description thereof will be omitted.

Also, the manufacturing method according to the present embodiment using such manufacturing apparatus is similar to the manufacturing method according to the first embodiment except the vapor deposition step is performed using the aforementioned circular shadow mask 31.

According to the manufacturing apparatus and method of the present embodiment, as in the first embodiment, the first through holes 21a of the substrate 21 and the second through holes 31a of the circular shadow mask 31 are fitted around alignment pins 11, and thus, an organic layer forming material 22 can be vapor-deposited on an anode layer 23 formed on the substrate 21 with alignment of the substrate 21 and the shadow mask 31 adjusted in the MD direction and the TD direction, enabling an organic layer to be formed on the anode layer 23 with good positional accuracy. Also, a cathode layer 27 can be formed on the organic layer in a manner similar to the above, while the alignment is being made as described above.

Figure 6:
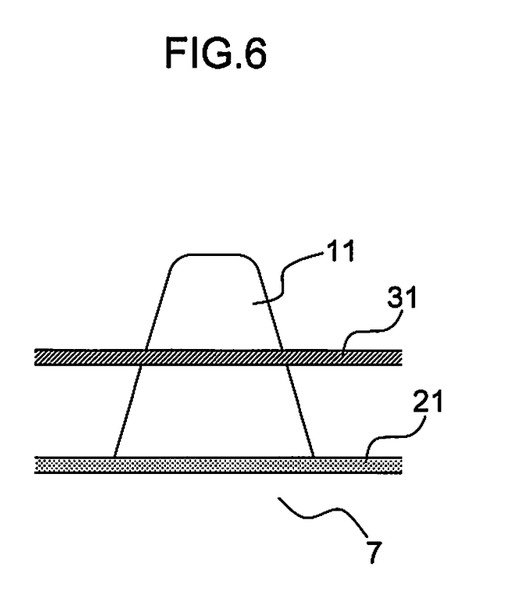
FIG. 6 is a schematic side view of an alignment pin used in an organic EL device manufacturing apparatus according to a third embodiment of the present invention.

Next, an organic EL device manufacturing method and apparatus according to a third embodiment of the present invention will be described. FIG. 6 is a schematic side view of an alignment pin 11 provided at a can roller 7 used in an organic EL device manufacturing apparatus according to a third embodiment of the present invention. Components that are common in FIGS. 1 to 3 are provided with common reference numerals and a description thereof will be omitted.

As illustrated in FIG. 6, in the manufacturing apparatus according to the present embodiment alignment pins 11 each have a rectangular shape in a cross section, and a taper shape tapering from the can roller 7 side (the base end side) toward a distal end thereof. In other words, the alignment pins 11 each have a quadrangular pyramid shape. Meanwhile, first through holes 21a of a substrate 21 each have a shape and size that are the same as those of base end portions of the alignment pins 11, and a diameter of second through holes 31a of a shadow mask 31 is smaller than a diameter of the first through holes 21a.

Consequently, upon the first through holes 21a being fitted around the alignment pins 11, a back surface of the substrate 21 is brought into contact with a circumferential surface of the can roller 7. Also, upon the second through holes 31a being fitted around the alignment pins 11, the shadow mask 31 is supported by the alignment pins 11 with a gap between the shadow mask 31 and the substrate 21. While the shadow mask 31 and the substrate 21 are aligned with the shadow mask 31 separated from the substrate 21 as described above, an evaporated organic layer forming material 22 is discharged from a vapor deposition source 9, passes through opening portions 31b and is deposited on an anode layer 23. Furthermore, while the alignment is being made as described above, a cathode layer 27 can be formed on the organic layer in such a manner as described above. The rest of configuration is similar to that of the manufacturing apparatus and method according to the first embodiment, and thus, a description thereof will be omitted.

Furthermore, the manufacturing method according to the present embodiment using such manufacturing apparatus is similar to the manufacturing method according to the first embodiment except that a vapor deposition step is performed using the aforementioned tapered alignment pins 11, the first through holes 21a, and the second through hole 31a having a diameter smaller than that of the first through holes 21a, and thus, a description thereof will be omitted.

In the manufacturing apparatus and method according to the present embodiment, the substrate 21 and the shadow mask 31 face each other with a gap therebetween, enabling prevention of breakage of the substrate 21 resulting from contact with the shadow mask 31.

An angle of tapering of the alignment pins 11 and the diameter of the second through holes 31a can arbitrarily be determined so that a desired gap can be formed between the substrate 21 and the shadow mask 31. Also, such gap can arbitrarily be determined according to, e.g., the state of formation of the organic layer on the anode layer 23.

Furthermore, in the present embodiment, when a pitch of the alignment pins 11 is large, the shadow mask 31 may be brought into contact with the substrate 21. Accordingly, taking such point into consideration in addition to the points described in the first embodiment above, the number and pitch of alignment pins in the MD direction can be determined: for example, twelve alignment pins 11 can be arranged at an equal pitch of 30° or 36 alignment pins 11 can be arranged at an equal pitch or 10°.

Although organic EL device manufacturing methods and apparatuses according to the present invention have been described above, the present invention is not limited to the above embodiments, and alterations can arbitrarily be made within the intended scope of the present invention. For example, in the first and second embodiments, the alignment pins 11 each have a quadrangular prism shape; however, the shape of the alignment pins 11 is not specifically limited to such shape and the alignment pins 11 can be designed to have any other shape that allows the first through holes 21a and the second through holes 31a to be engaged with each other to adjust alignment between the substrate 21 and the shadow mask 31, such as a triangular prism shape, a circular column shape or a column shape having a star shape in a cross section, for example.

Also, in the third embodiment, the alignment pins 11 each have a quadrangular pyramid shape; however, in this case, also, the shape of the alignment pins 11 is not specifically limited to such shape, and any other shape that allows the first through holes 21a and the second through holes 31a to be fitted therearound to adjust alignment between the substrate 21 and the shadow mask 31 and a gap to be formed between the substrate 21 and the shadow mask 31, such as a triangular pyramid shape, a circular cone shape, or a column shape having a star shape in a cross section and a cross-sectional area decreasing toward a distal end thereof, for example.

Furthermore, in the above embodiments, vacuum vapor deposition has been used as a method for forming an organic layer on the anode layer 23 formed on the substrate 21; however, the layer formation method is not specifically limited to those in the above embodiments, and another method such as electron beam (EB) vapor deposition, sputtering or chemical vapor deposition, for example, can be employed.

Furthermore, in the above embodiments, one shadow mask supply device 6a is arranged in the vacuum chamber 3 to supply one shadow mask 31 from the shadow mask supply device 6a so that the shadow mask 31 overlaps the substrate 21 in a roll-to-roll manner: however, otherwise, a plurality of shadow mask supply devices can be arranged in the vacuum chamber 3 to supply a plurality of shadow masks 31 from the respective shadow mask supply devices so as to face the substrate 21.

EXAMPLE

Next, the present invention will be described in further detail taking an example; however, the present invention is not limited to such example.

Example

The manufacturing apparatus 1 according to the first embodiment, which is illustrated in FIG. 1, was used. For a substrate 21, a rolled-up SUS 304 (with a width of 50 mm, a length of 1000 m and a thickness of 0.05 mm) was used, and as a material for forming an anode layer 23, IZO was used. A resin layer (JEM-477 manufactured by JSR Corporation) was coated onto the substrate 21, and then dried and cured to form an insulating layer with a thickness of 3 μm, and then, an IZO layer with a thickness of 100 nm was formed by sputtering on the entire insulating layer, and a photolithographic process was performed so as to leave pieces of 35 mm×102.62 mm of the IZO layer at an interval of 2.1 mm in a longitudinal direction (MD direction) at positions in a range of 5 mm to 10 mm from opposite ends in a width direction (TD direction), thereby forming a pattern of the anode layer 23 including the IZO layer (patterning).

Furthermore, using etching, first through holes 21a of 2.1 mm×2.1 mm (R: 0.5 mm) each having a corner-rounded square shape were formed in the longitudinal direction at opposite end portions in the width direction of the substrate 21 so that centers of the corner-rounded square shapes are arranged 3 mm from the respective ends in the width direction (TD direction) at a pitch of 104.72 mm in a direction of movement of the substrate 21 (MD direction), and each of the first through holes 21a is arranged between respective pieces in the pattern of the anode layer 23.

For the shadow mask 31, two rolled-up SUSs 304 (with a width of 50 mm a length of 1000 mm and a thickness of 0.05 mm) (referred to as "shadow masks 31A and 31B") were used. In the shadow mask 31A, using photo-etching, second through holes 31a each having a corner-rounded square shape of 2.1 mm×2.1 mm (R: 0.5 mm) were formed in the longitudinal direction at opposite ends in a width direction of the shadow mask 31A so that centers of the corner-rounded square shapes are arranged 3 mm from the respective ends in the width direction (TD direction) at a pitch of 104.72 mm in a direction of movement of the shadow mask 31A (MD direction). Furthermore, simultaneously with the formation of the second through holes 31a, an opening portion 31b of 36 mm×102.62 mm was formed by photo-etching at a center of each space formed by four second through holes 31a including two in the TD direction and two in the MD direction, thereby forming the shadow mask 31A.

For the shadow mask 31B, using photo-etching, second through holes 31a were formed at positions like those of the shadow mask 31A, and simultaneously with the formation of the second through holes 31a, an opening portion 31b of 30 mm×90 mm was formed by photo-etching at a center of each space between the respective second through holes 31a in the MD direction at a position in a range of 10 mm to 5 mm from respective ends in the TD direction, thereby forming the shadow mask 31B.

On each of three can rollers 7 each having a diameter of 1200 mm, 36 alignment pins 11 of a corner-rounded regular quadrangular pyramid shape each having a corner-rounded square bottom surface of 2 mm×2 mm (R: 0.5 mm), a corner-rounded square upper surface of 1.5 mm×1.5 mm (R: 0.5 mm) and a height of 3 mm were formed at a pitch of 10° with reference to a rotation axis of the can roller 7.

Figure 7:
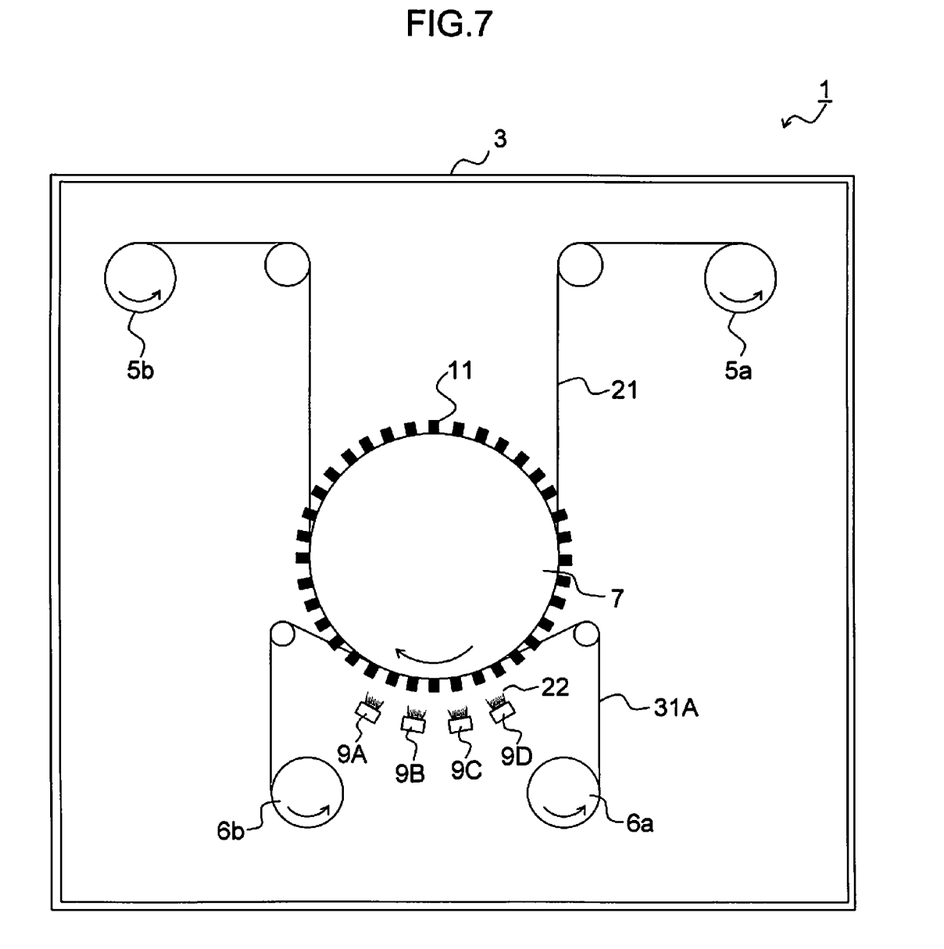
FIG. 7 is a schematic sectional side view of a configuration when organic layers are formed in an organic EL device manufacturing apparatus used in an example.

Also, as illustrated in FIG. 7, at a position facing a region of each can roller 7 that supports the substrate 21, a vapor deposition source 9A for vapor-depositing a CuPc layer, which is a hole injection layer, a vapor deposition source 9B for vapor-depositing an α-NPD layer, which is a hole transport layer, a vapor deposition source 9C for vapor-depositing an Alq3 layer, which is a light-emitting layer, and a vapor deposition source 9D for vapor-depositing an LiF layer, which is an electron injection layer, are arranged in this order from the upstream side to the downstream side in a direction of rotation of the can roller 7.

Then, as described above, after plasma processing of the substrate 21, the first through holes 21a of the substrate 21 and the second through holes 31a of the shadow mask 31A were fitted around the alignment pins 11 to align the substrate 21 and the shadow mask 31A, respective organic layer forming materials 22 were evaporated and discharged by the vapor deposition sources 9A to 9D to sequentially deposit a CuPc layer, an α-NPD layer an Alq3 layer and an LiF layer on the substrate 21 to form a four-layer structure of organic layers, and then, the substrate 21 and the shadow mask 31A were wound up. It should be noted that vapor-deposition of a cathode layer 27 can be performed following the vapor deposition of the organic layers without winding the shadow mask 31A up.

Next, as illustrated in FIG. 8, a vapor deposition source 9E for vapor-depositing aluminum (Al), which is a cathode, was arranged in place of the vapor deposition sources 9A to 9D at the position facing the region of the can roller 7 that supports the substrate 21 in the vacuum chamber 3, and the first through holes 21a of the substrate 21 and the second through holes 31a of the shadow mask 31B were fitted around the alignment pins 11 to align the substrate 21 and the shadow mask 31B, and a cathode layer forming material 26 was evaporated and discharged by the vapor deposition source 9E to deposit an Al layer on the organic layers, and then, the substrate 21 and the shadow mask 31B were wound up.

Upon an electric field being applied to the anode layer 23 and the cathode layer 27 of the wound-up substrate 21, the organic layer emitted light. Also, when the amounts of displacement of the organic layers and the cathode layer 27 from respective design values are measured every 10 mm in the MD direction using a laser measurement system unit (LV-9300 manufactured by Ono Sokki, Co. Ltd.), it has been found that the amount of displacement is a maximum of 0.2 mm regardless of the length of transport (position in the MD direction) and thus, the displacement amount is small. It has also been found that the displacement amount is small regardless of the materials of the layers formed on the substrate 21.

Comparative Example

Organic layers and a cathode layer were formed on a substrate in a manner similar to that of the example except use of can rollers including no alignment pins, and a substrate and a shadow mask each including no through holes. Also, the amount of displacement of the organic layers and the cathode layer from respective design values were measured as in the example. As a result, the amounts of displacement of the organic layers and the cathode layer were a maximum of 500 mm in the MD direction.

As a result of the above, it has been found that an organic EL device manufacturing method and apparatus according to the present invention enables efficient manufacture of organic EL devices by adjusting the alignment of respective layers formed on a substrate in a direction of movement thereof and a direction perpendicular to the direction of movement without employing a complicated configuration.

This specification is by no means intended to restrict the present invention to the preferred embodiments set forth therein. Various modifications to the organic EL device manufacturing method and apparatus, as described herein, may be made by those skilled in the art without departing from the spirit and scope of the present invention as defined in the appended claims.

The invention claimed is:

1. An organic EL device manufacturing method including forming an organic layer on an electrode-layer side of a strip-shaped substrate, while moving the substrate, the electrode-layer side being provided with an electrode layer, comprising:
   a vapor deposition step of supplying the strip-shaped substrate, and while moving the substrate with a non-electrode-layer side thereof in contact with a surface of a can roller that rotates, discharging an evaporated organic layer forming material from a nozzle of a vapor deposition source arranged so as to face the can roller to form an organic layer on the electrode-layer side of the substrate, the non-electrode layer side being provided with no electrode layer,
   wherein the vapor deposition step further comprises:
      supplying a shadow mask including an opening portion so as to interpose the shadow mask between the substrate held in contact with the can roller, and the nozzle;
   and
      by using a substrate and a shadow mask each including a plurality of through holes arranged in a longitudinal direction for the substrate and the shadow mask, respectively, and using a can roller including projections that engage with the through holes for the can roller, forming the organic layer corresponding to the opening portion on the electrode-layer side of the substrate, while moving the substrate and the shadow mask with the through holes of the substrate and the shadow mask engaged with the projections;
   wherein the projections each have a taper shape tapering from a can roller side thereof toward a distal end thereof, and a diameter of the through holes of the shadow mask is smaller than a diameter of the through holes of the substrate such that when through holes of the shadow mask and the substrate are fully engaged with the projections, a gap is formed between the shadow mask and the substrate.

2. A method for manufacturing an organic EL device, comprising:
   preparing a strip-shaped substrate having a first surface on which an electrode layer is formed and a second surface on which an electrode layer is not formed;
   supplying the substrate so that the second surface is in contact with a can roller; and
   forming an organic layer on the first surface of the substrate by discharging an evaporated organic layer forming material from a nozzle of a vapor deposition source located so as to face the can roller, while supplying a shadow mask including an opening portion so that the shadow mask is interposed between the substrate and the nozzle, wherein:
   each of the substrate and the shadow mask has a plurality of through holes in a longitudinal direction;
   the can roll has projections which engage with the through holes;
   the organic layer is formed so as to correspond to the opening portion on the first surface of the substrate, while moving the substrate and the shadow mask so that the through holes of the substrate and the shadow mask are engaged with the projections, and
   the projections each have a taper shape tapering from a can roller side thereof toward a distal end thereof, and a diameter of the through holes of the shadow mask is smaller than a diameter of the through holes of the substrate such that when through holes of the shadow mask and the substrate are fully engaged with the projections, a gap is formed between the shadow mask and the substrate.

* * * * *